(12) United States Patent
Saadany et al.

(10) Patent No.: US 10,782,342 B2
(45) Date of Patent: Sep. 22, 2020

(54) INTEGRATED OPTICAL PROBE CARD AND SYSTEM FOR BATCH TESTING OF OPTICAL MEMS STRUCTURES WITH IN-PLANE OPTICAL AXIS USING MICRO-OPTICAL BENCH COMPONENTS

(71) Applicant: Si-Ware Systems, Cairo (EG)

(72) Inventors: Bassam Saadany, Cairo (EG); Mostafa Medhat, Cairo (EG); Muhammad Nagi, Cairo (EG); Ahmed Shebl, Cairo (EG); Yasser M. Sabry, Cairo (EG); Bassem Mortada, Cairo (EG); Diaa Khalil, Cairo (EG)

(73) Assignee: SI-WARE SYSTEMS, Cairo (EG)

( * ) Notice: Subject to any disclaimer, the term of this patent is extended or adjusted under 35 U.S.C. 154(b) by 242 days.

(21) Appl. No.: 15/818,736

(22) Filed: Nov. 20, 2017

(65) Prior Publication Data

US 2018/0143245 A1 May 24, 2018

Related U.S. Application Data

(60) Provisional application No. 62/425,028, filed on Nov. 21, 2016.

(51) Int. Cl.
| | | |
|---|---|---|
| *G01R 31/308* | (2006.01) | |
| *G01M 11/00* | (2006.01) | |
| *B81C 99/00* | (2010.01) | |
| *G01R 1/07* | (2006.01) | |
| *G01R 31/28* | (2006.01) | |

(Continued)

(52) U.S. Cl.
CPC .......... *G01R 31/308* (2013.01); *B81C 99/005* (2013.01); *G01M 11/31* (2013.01); *G01M 11/33* (2013.01); *G01M 11/35* (2013.01); *G01R 1/071* (2013.01); *G01R 31/2831* (2013.01); *G02B 6/4203* (2013.01); *G02B 26/001* (2013.01); *B81B 2201/047* (2013.01); *G02B 6/4214* (2013.01)

(58) Field of Classification Search
CPC ..... G01R 31/275; G01R 31/308; G01R 1/071
See application file for complete search history.

(56) References Cited

U.S. PATENT DOCUMENTS

| | | | |
|---|---|---|---|
| 5,990,473 A | * | 11/1999 | Dickey .............. G01D 5/34723 250/221 |
| 6,686,993 B1 | | 2/2004 | Karpman et al. |
| 2006/0109015 A1 | | 5/2006 | Thacker et al. |

(Continued)

OTHER PUBLICATIONS

International Search Report & Written Opinion for PCT/US17/062854 dated Feb. 9, 2017; 12 pages.

*Primary Examiner* — Walter L Lindsay, Jr.
*Assistant Examiner* — Milton Gonzalez
(74) *Attorney, Agent, or Firm* — Loza & Loza, LLP; Holly L. Rudnick

(57) ABSTRACT

Aspects relate to an integrated optical probe card and a system for performing wafer testing of optical micro-electro-mechanical systems (MEMS) structures with an in-plane optical axis. On-wafer optical screening of optical MEMS structures may be performed utilizing one or more micro-optical bench components to redirect light between an out-of-plane direction that is perpendicular to the in-plane optical axis to an in-plane direction that is parallel to the in-plane optical axis to enable testing of the optical MEMS structures with vertical injection of the light.

21 Claims, 16 Drawing Sheets

(51) Int. Cl.
  *G02B 6/42*    (2006.01)
  *G02B 26/00*   (2006.01)

(56) References Cited

U.S. PATENT DOCUMENTS

2007/0096763 A1   5/2007   Ehrmann et al.
2011/0279109 A1   11/2011  Masuda
2014/0363905 A1   12/2014  McShane et al.

* cited by examiner

INTEGRATED OPTICAL PROBE CARD AND SYSTEM FOR BATCH TESTING OF OPTICAL MEMS STRUCTURES WITH IN-PLANE OPTICAL AXIS USING MICRO-OPTICAL BENCH COMPONENTS

PRIORITY CLAIM

This application claims priority to and the benefit of Provisional Application No. 62/425,028, filed in the U.S. Patent and Trademark Office on Nov. 21, 2016, the entire content of which is incorporated herein by reference as if fully set forth below in its entirety and for all applicable purposes.

TECHNICAL FIELD

The technology discussed below relates generally to probe cards used to perform on-wafer testing of dies, and in particular to probe cards for on-wafer testing of optical micro-electro-mechanical systems (MEMS) structures.

BACKGROUND

Electronic probe cards are widely used by semiconductor manufacturers to characterize thousands of chips or dies at the wafer level. Commercially available electronic probe cards typically include vertical metallic needles that are designed to make contact with the dies at specific locations to supply input electrical signals to the devices under test on the dies and then probe out the output signals.

With the introduction of complementary metal oxide (CMOS) sensors, light emitting diodes (LEDs), optical detectors, and other miniaturized optical devices, optoelectronic probe cards have been developed to characterize and test the functionally and the performance of these devices on the wafer level. For example, optoelectronic probe cards have been used to test photodiodes on the wafer level, in which the light beam is injected vertically via a fiber coil and at the same time the electronic probe senses the output electrical signal from the photodiode under test. The same technique has also been used to characterize an array of LEDS using an array of lenses and an array of optical waveguides. On-wafer micro-mirrors have also been characterized by injecting and receiving the optical light vertically.

In addition, on-wafer measurements of devices (e.g., optical circuits and planar light-wave circuits (PLCs)) that include optical components requiring light to propagate parallel to the wafer have been performed utilizing testing equipment that injects the light horizontally in-plane. However, such optical testing devices that access the wafer from a side of the wafer with horizontal light coupling cannot be easily integrated into traditional electronic probe cards.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide an integrated optical probe card and a system for performing wafer testing of optical micro-electro-mechanical systems (MEMS) structures with an in-plane optical axis. On-wafer optical screening of optical MEMS structures may be performed utilizing one or more micro-optical bench components to redirect light between an out-of-plane direction that is perpendicular to the in-plane optical axis to an in-plane direction that is parallel to the in-plane optical axis to enable testing of the optical MEMS structures with vertical injection of the light. Such a configuration enables the optical probe card to be assembled on one or more electronic needles of an electronic probe card.

In some examples, the micro-optical bench component(s) may be integrated with the optical probe card. In other examples, the micro-optical bench component(s) may be fabricated on the wafer containing the optical MEMS structures. For example, the micro-optical bench component(s) may be fabricated in the dicing streets of the wafer.

In one aspect of the disclosure, an integrated optical probe card for batch testing optical MEMS structures is provided. The integrated optical probe card includes a source configured to generate an input beam and to provide the input beam towards an optical MEMS structure, where the optical MEMS structure includes an in-plane optical axis and the input beam propagates in an out-of-plane direction perpendicular to the in-plane optical axis. The integrated optical probe card further includes a detector optically coupled to receive an output beam from the optical MEMS structure, where the output beam propagates in the out-of-plane direction. The integrated optical probe card further includes a micro-optical bench component optically coupled to redirect the input beam and the output beam between the out-of-plane direction and an in-plane direction that includes the in-plane optical axis of the optical MEMS structure.

Another aspect of the disclosure provides a wafer including a plurality of dies under test, each including a respective one of a plurality of optical MEMS structures that includes an in-plane optical axis. The wafer further includes a plurality of micro-prisms fabricated within a plurality of dicing streets between the plurality of dies under test. Each of the micro-prisms includes at least one of a first surface or a second surface. The first surface may be configured to receive an input beam from an optical probe card propagating in an out-of-plane direction perpendicular to the in-plane optical axis and to redirect the input beam from the out-of-plane direction to an in-plane direction including the in-plane optical axis towards the optical probe card. The second surface may be configured to receive an output beam from the optical MEMS structure propagating in the in-plane direction and to redirect the output beam from the in-plane direction to the out-of-plane direction towards the optical probe card.

Another aspect of the disclosure provides system for performing wafer testing. The system includes a wafer including a plurality of dies under test, each including a respective one of a plurality of optical MEMS structures having an in-plane optical axis. The system further includes an optical probe card including a source configured to generate an input beam and to provide the input beam towards an optical MEMS structure of the plurality of optical MEMS structures, where the input beam propagates in an out-of-plane direction perpendicular to the in-plane axis. The optical probe card further includes a detector optically coupled to receive an output beam from the optical MEMS structure, where the output beam propagates in the out-of-plane direction. The system further includes a micro-optical bench component optically coupled to redirect the input beam and the output beam between the out-of-plane direction and an in-plane direction that includes the in-plane optical axis of the optical MEMS structure.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
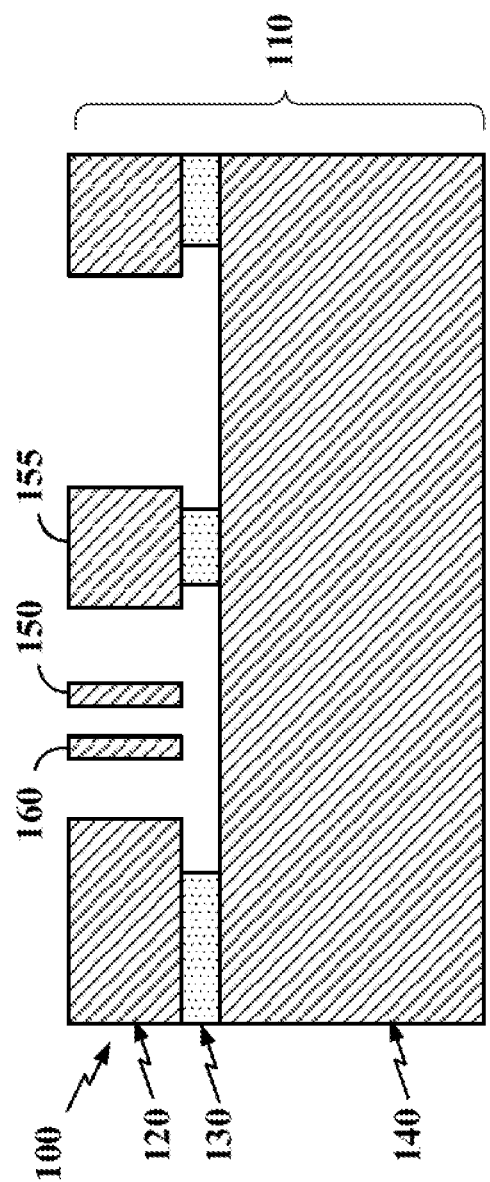
FIG. 1 is a diagram illustrating an example of an optical MEMS structure that may be fabricated on a wafer, according to some aspects of the disclosure.
Figure 2:
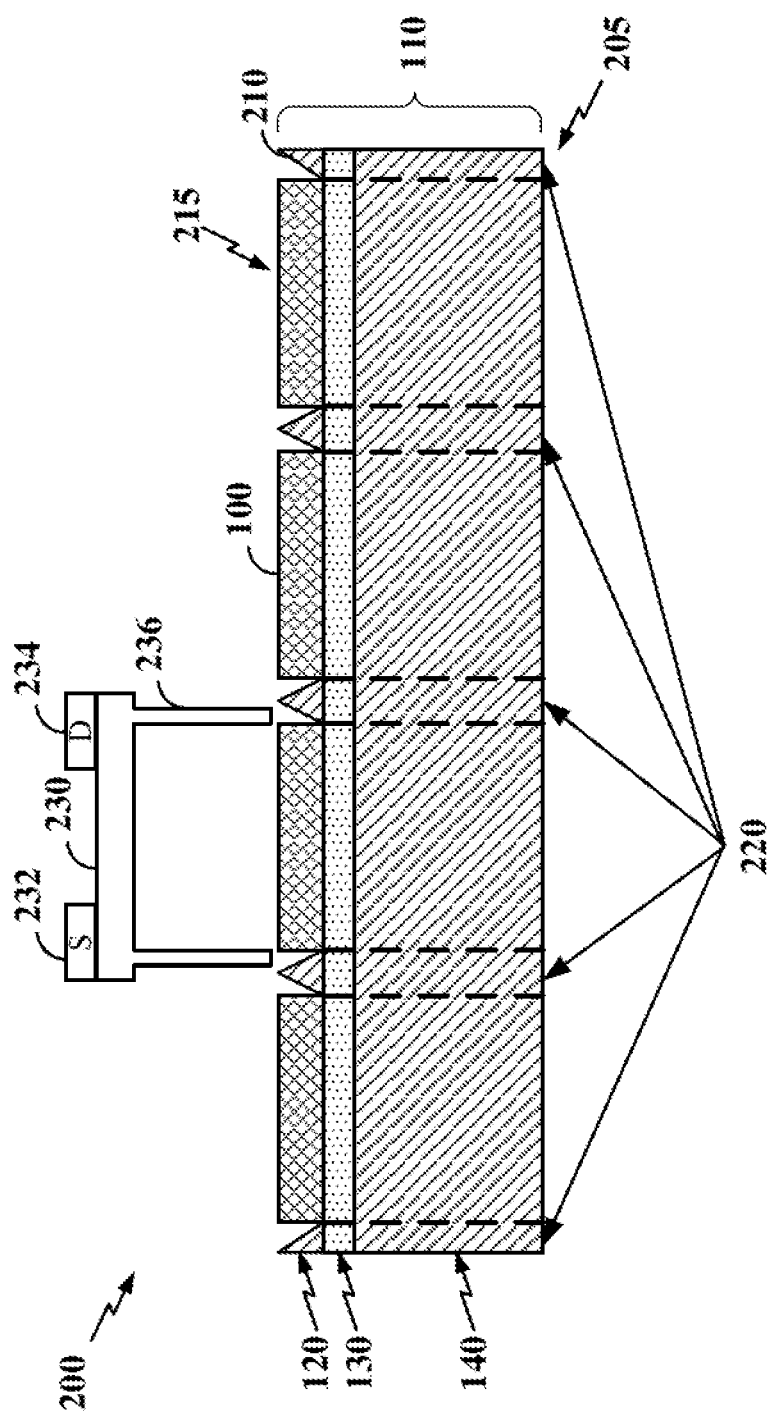
FIG. 2 is a diagram illustrating an example of a system including a wafer having optical MEMS structures therein for testing using an optical probe card and micro-optical bench components fabricated on the wafer, according to some aspects of the disclosure.

FIG. 1 illustrates an example of an optical micro-electro-mechanical systems (MEMS) structure 100 that may be fabricated on a wafer. The optical MEMS structure 100 shown in FIG. 1 may be, for example, an interferometer fabricated in a semiconductor substrate 110 of the wafer. The semiconductor substrate 110 may be, for example, a silicon-on-insulator (SOI) wafer that includes a device layer 120, a handle layer 140, and a buried oxide (BOX) layer 130 sandwiched between the device layer 120 and the handle layer 140. Various components of the MEMS interferometer, such as mirrors 150 and 155, a MEMS actuator 160, and other optical components may be defined using a single lithographic step and etched in the device layer 120 using a highly anisotropic process until the etch stop (BOX) layer 130 is reached. Any moveable parts, such as a moveable mirror 150 and the MEMS actuator 160 may be released by selectively removing the BOX layer 130 underneath the moveable parts. The FIG. 2 illustrates an example of a system 200 including a wafer 205 and an optical probe card 230, according to some aspects of the disclosure. The wafer 205 includes a plurality of die 215, each having a respective optical MEMS structures 100 fabricated thereon. The optical MEMS structures 100 may be similar to the MEMS interferometer shown in FIG. 1 or may be any other type of optical MEMS device having an in-plane optical axis. As used herein, the term "in-plane" refers to a propagation direction of light that is parallel to the wafer 205.

As can be seen in FIG. 2, the wafer 205 includes the semiconductor substrate 110 comprised of the device layer 120, handle layer 140, and BOX layer 130. The optical MEMS structures 100 are defined in the device layer 120 and are separated from one another by respective dicing streets 220 in the wafer 205. The dicing streets 220 define the area between the dies 215 through which the wafer 205 may be sliced to divide the wafer 205 into the respective dies 215.

In various aspects of the disclosure, one or more micro-optical bench components 210 may also be fabricated in the device layer 120 within each of the plurality of dicing streets 220 on the wafer 205. In the example shown in FIG. 2, the micro-optical bench components 210 include micro-prisms with forty-five degree inclined surfaces. However, it should be understood that the micro-optical bench components 210 may include other or additional components. Examples of micro-optical bench components 210 include, but are not limited to, micro-prisms, micro-mirrors, micro-lenses, and/or micro-beam splitters.

The micro-optical bench components 210 may be fabricated, for example, from the silicon material in the device layer 120, and may be metallized or coated with another reflective material on the forty-five degree inclined surfaces to improve the optical coupling. The micro-optical bench components 210 are designed for testing (DFT) using wafer level testing via the optical probe card 230. Since the micro-optical bench components 210 are fabricated in the dicing streets 220, the die area on the wafer 205 may be maximized. Thus, after the on-wafer testing, the dies 215 may be diced, thereby removing the micro-optical bench components 210.

The optical probe 230 includes a source 232 (light source), a detector 234 and at least one optical fiber 236 (two of which are illustrated in FIG. 2). The source 232 may include a broadband light source or narrow-band light source. For example, the source 232 may include one or more wideband thermal radiation sources or a quantum source with an array of light emitting devices that cover a wavelength of interest. The detector 234 may include, for example, a detector array or a single pixel detector. The optical fibers 236 may include, for example, single core fibers, dual core fibers, or fiber bundles.

The source 232 is configured to generate an input beam of light and to direct the input beam via an input optical fiber 236 towards an input micro-optical bench component 210 on the wafer 205 located adjacent to an input of an optical MEMS structure 100 on a die 215 under test. As shown in FIG. 2, the input fiber 236 directs the input beam to propagate in an out-of-plane direction with respect to a plane of the wafer 205. As used herein, the term "out-of-plane" refers to a propagation direction of light that is perpendicular to the wafer 205. Since the optical MEMS structure 100 under test has an in-plane optical axis that is perpendicular to the out-of-plane propagation direction of the input beam from the input optical fiber 236, the input micro-optical bench component 210 is configured to redirect the input beam from the out-of-plane direction to an in-plane direction that is parallel to the wafer 205 and that includes the in-plane optical axis of the optical MEMS structure 100 under test. The input micro-optical bench component 210 may then direct the input beam to the optical MEMS structure 100 under test for propagation inside the optical MEMS structure 100. The input beam may propagate in-plane inside the optical MEMS structure 100 utilizing free space propagation or waveguide/guided propagation.

In the example shown in FIG. 2, another micro-optical bench component 210 is located adjacent to an output of the optical MEMS structure 100 under test to receive an output beam propagating parallel to the wafer 205 (e.g., in an in-plane direction). The output micro-optical bench component 210 is configured to redirect the output beam from the in-plane direction to the out-of-plane direction towards an output optical fiber 236. The output optical fiber 236 then directs the output beam towards the detector 234. Thus, each of the micro-optical bench components 210 is optically coupled to redirect the input beam and the output beam between the out-of-plane direction and the in-plane direction that includes the in-plane optical axis of the optical MEMS structure 100 to facilitate in-plane (horizontal) wafer level testing of dies 215.

Figure 3:
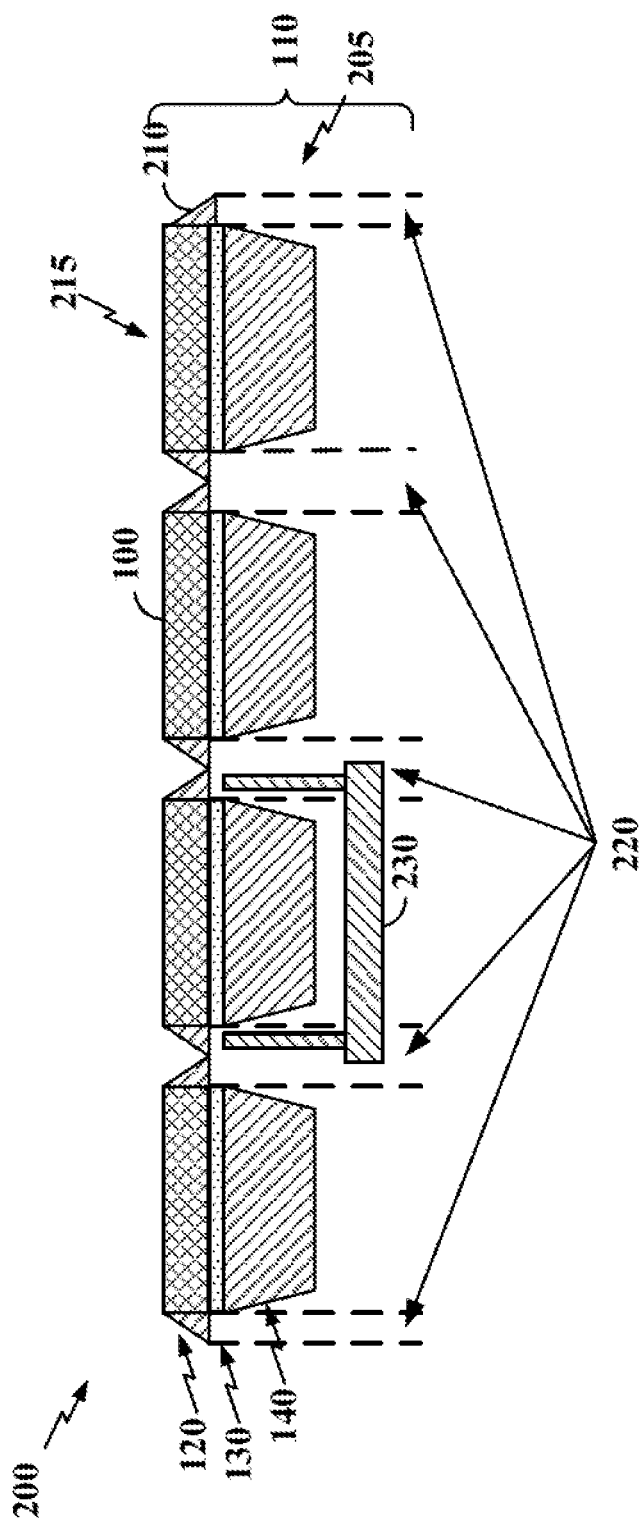
FIG. 3 is a diagram illustrating another example of a system including a wafer having optical MEMS structures therein for testing using an optical probe card and micro-optical bench components fabricated on the wafer, according to some aspects of the disclosure.

FIG. 3 is a diagram illustrating another example of a testing system 200 in which the micro-optical bench components 210 are fabricated on the wafer 205, according to some aspects of the disclosure. In the example shown in FIG. 3, the backside of the wafer 205 is etched in the dicing streets 220 to enable backside testing of the dies 215 by the optical probe card 230. In addition, the micro-optical bench components (micro-prisms) 210 are not metallized, thus facilitating the use of total internal reflection at the forty-five degree inclined interfaces of the micro-prisms to redirect the input and output beams between the out-of-plane direction and the in-plane direction.

Figure 4:
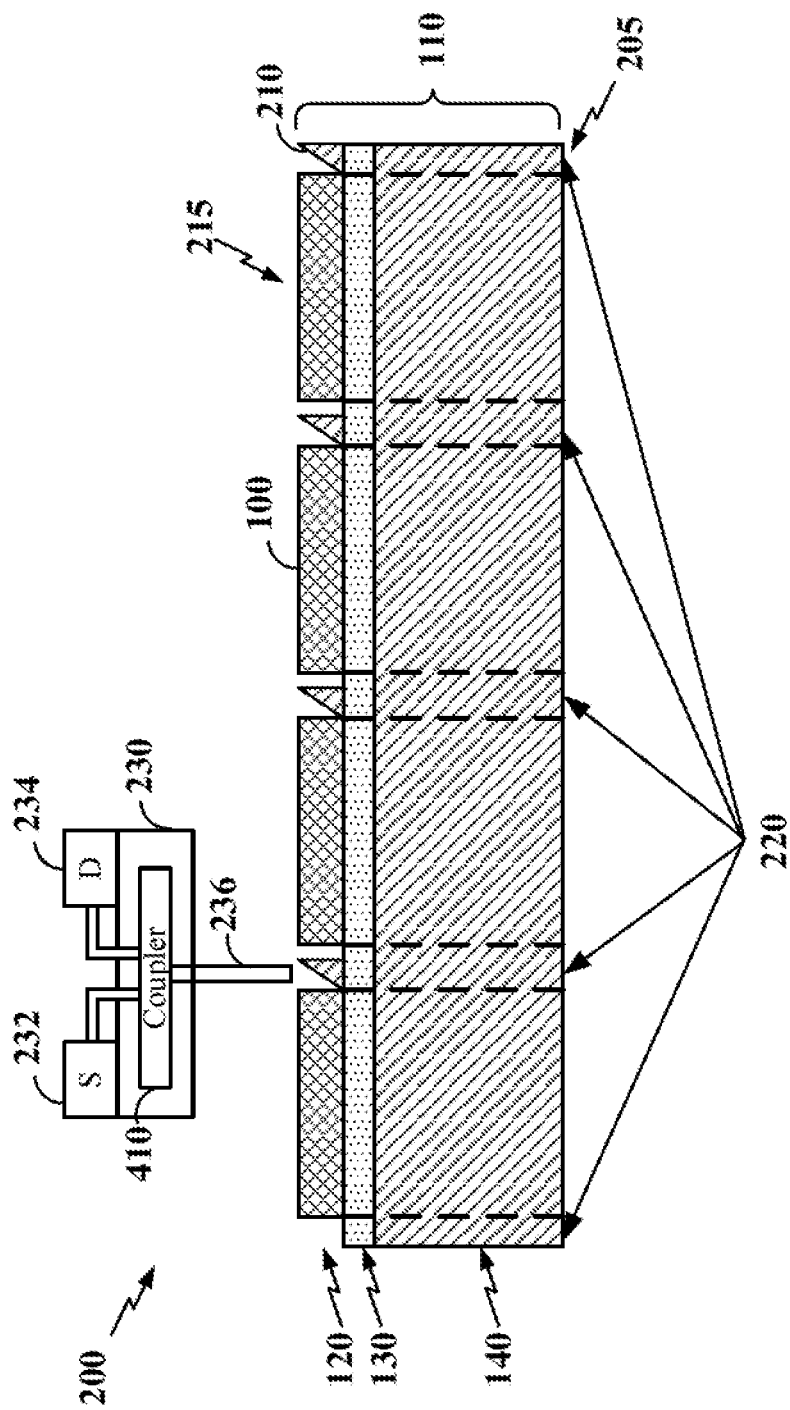
FIG. 4 is a diagram illustrating another example of a system including a wafer having optical MEMS structures therein for testing using an optical probe card and micro-optical bench components fabricated on the wafer, according to some aspects of the disclosure.

FIG. 4 is a diagram illustrating another example of a testing system in which the micro-optical bench components 210 are fabricated on the wafer 205, according to some aspects of the disclosure. In the example shown in FIG. 4, the optical probe card 230 includes only a single optical port used for both transmitting and receiving the optical input/output beams. In this example, the optical probe card 230 includes a single optical fiber 236 optically coupled to a directional coupler 410 that directs the input beam from the source 232 to the optical fiber 236, which may then direct the input beam towards a micro-optical bench component 210 associated with a die 215 under test. The directional coupler 410 further directs the reflection signal (output beam) received by the optical fiber 236 from the micro-optical bench component 210 towards the detector 234. In some examples, the source 232 and coupler 410 may each be wideband, thus enabling wavefront division couplers and/or free space couplers or beam splitters to be utilized as the directional coupler 410.

Thus, with this configuration, only a single micro-optical bench component (micro-prism) 210 may need to be fabricated in each of the dicing streets 220. The single input/output port, single core optical fiber 236, and directional coupler 410 configuration of the optical probe card 230 may also be utilized in embodiments in which the micro-optical bench components 210 are integrated on the optical probe card 230, such as any of the embodiments shown in FIGS. 6-13.

Figure 5:
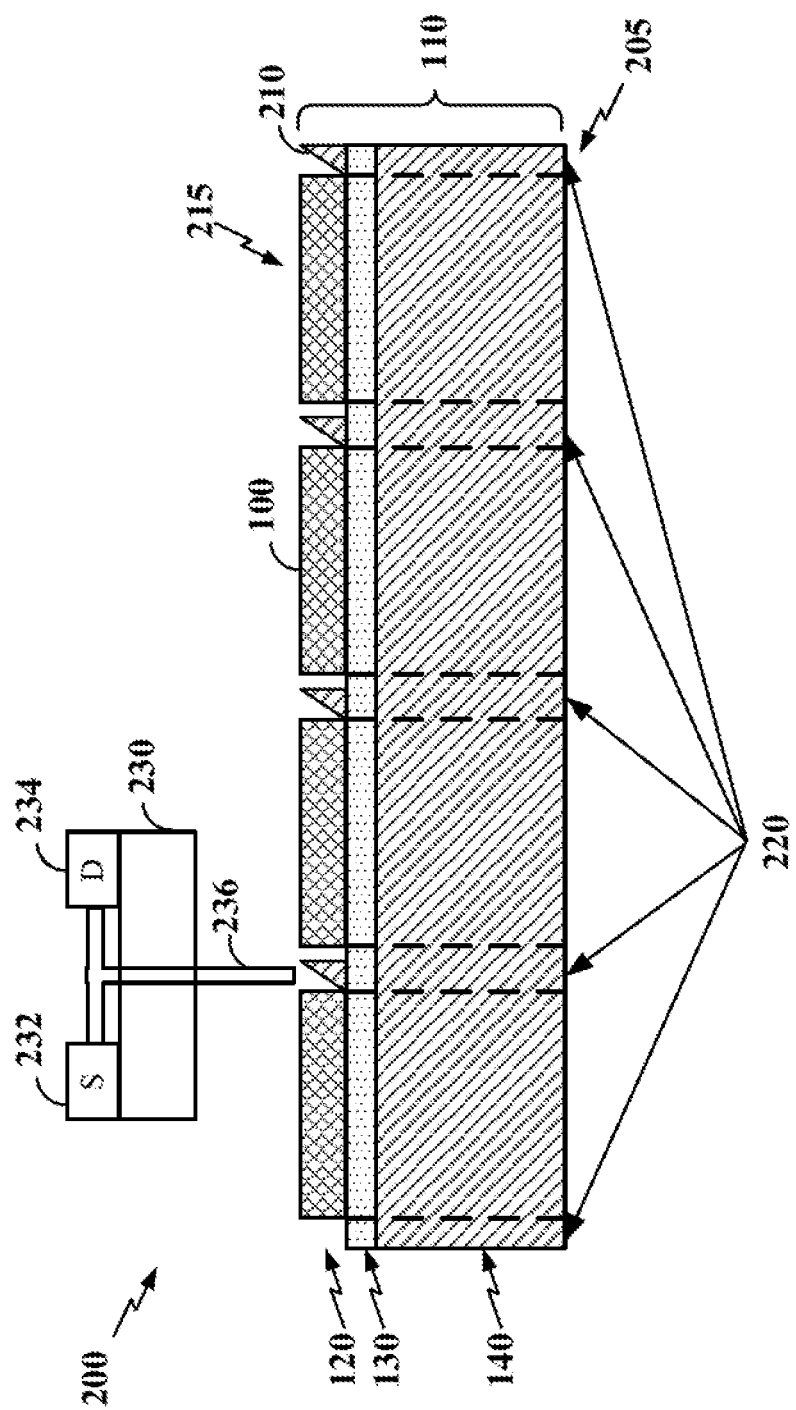
FIG. 5 is a diagram illustrating another example of a system including a wafer having optical MEMS structures therein for testing using an optical probe card and micro-optical bench components fabricated on the wafer, according to some aspects of the disclosure.

FIG. 5 is a diagram illustrating another example of a testing system 200 in which the micro-optical bench components 210 are fabricated on the wafer 205, according to some aspects of the disclosure. As in the example shown in FIG. 4, the optical probe card 230 includes a single input/ output port, along with a single optical fiber 236. However, in the example shown in FIG. 5, the optical fiber 236 may be a dual core fiber or a fiber bundle. The dual core fiber 236 may include two adjacent fiber cores, one that serves as the input and is optically coupled to the source 232 and one that serves as the output and is optically coupled to the detector 234. The fiber bundle 236 may include multiple adjacent cores, some of which serve as the input and are optically coupled to the source, and others that serve as the output and are optically coupled to the detector 234. Thus, the dual core optical fiber or fiber bundle 236 may include separate input and output fiber ports, each connected to the source 232 and detector 234, respectively. The dual core/fiber bundle configuration of the optical fiber 236 of the optical probe card 230 may also be utilized in embodiments in which the micro-optical bench components 210 are integrated on the optical probe card 230, such as any of the embodiments shown in FIGS. 6-15.

Figure 6:
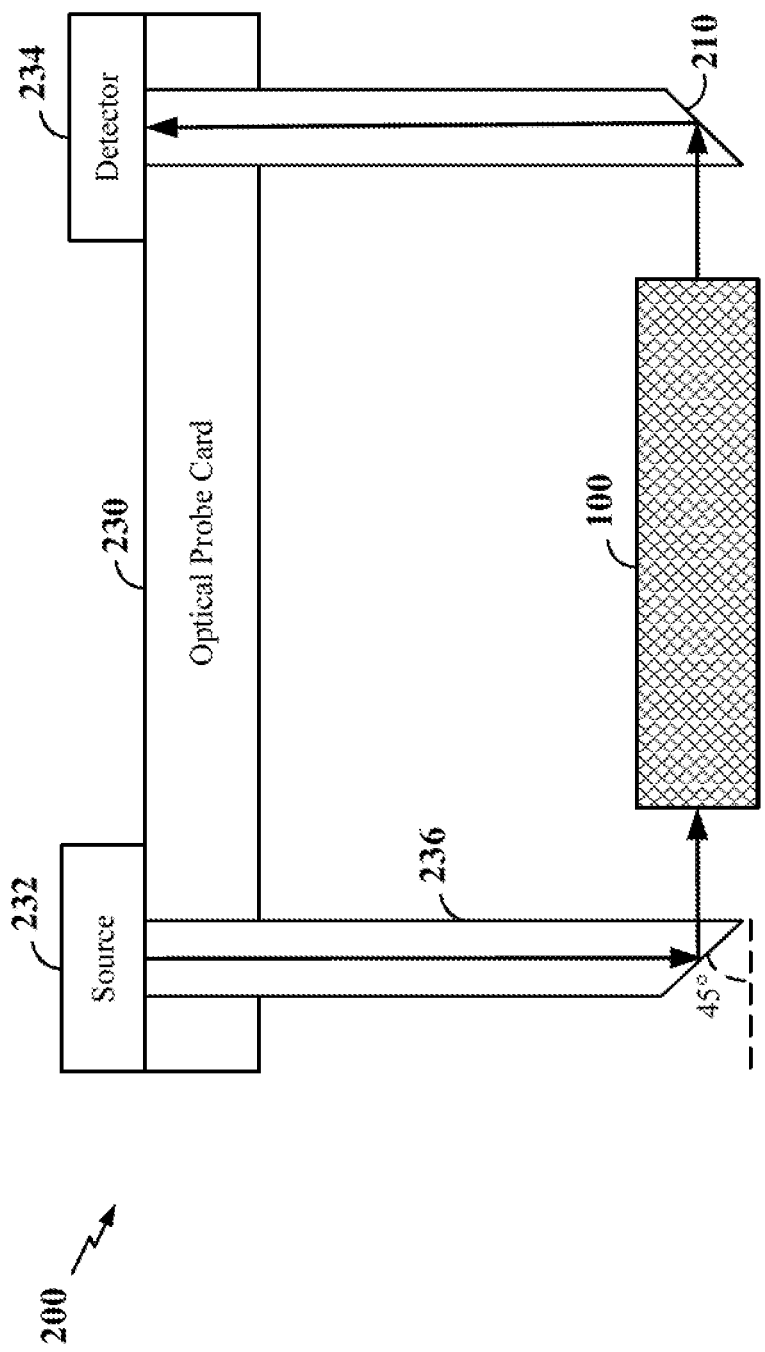
FIG. 6 is a diagram illustrating an example of a system including an integrated optical probe card having micro-optical bench components for testing an optical MEMS structure on the wafer level, according to some aspects of the disclosure.

FIG. 6 is a diagram illustrating an example of a testing system 200 in which the micro-optical bench components 210 are integrated on the optical probe card 230, according to some aspects of the disclosure. The optical probe card 230 includes two optical fibers 236, each cleaved with a respective cleaving angle of forty-five degrees, thereby employing total internal reflection from the forty-five degree cleaved glass interface to redirect the input and output beams between the out-of-plane direction and the in-plane direction. Thus, the micro-optical bench components 210 are formed at the cleaved glass interface of the optical fibers 236.

In an exemplary operation, the source 232 may generate an input beam and direct the input beam via the input optical fiber 236 towards the cleaved glass interface 210 of the input optical fiber 236 positioned adjacent to an input of an optical MEMS structure 100 under test. The cleaved glass interface of the input optical fiber 236 functions as the input micro-optical bench component 210 that is optically coupled to redirect the input beam from the out-of-plane direction to the in-plane direction towards the input of the optical MEMS structure 100 under test. The cleaved glass interface of the output optical fiber 236 positioned adjacent to an output of the optical MEMS structure 100 under test functions as the output micro-optical bench component 210 to receive the output beam propagating in the in-plane direction and to redirect the output beam from the in-plane direction to the out-of-plane direction towards the detector 234.

Figure 7:
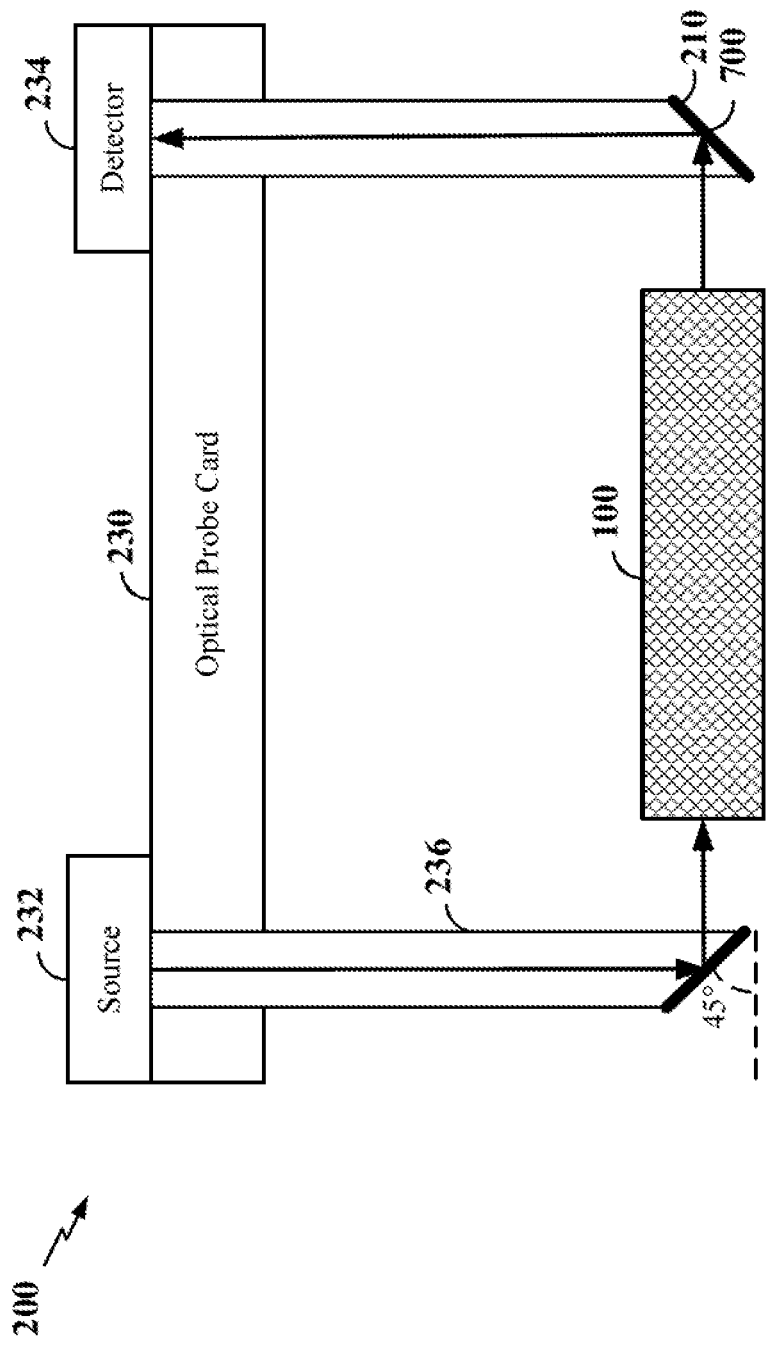
FIG. 7 is a diagram illustrating another example of a system including an integrated optical probe card having micro-optical bench components for testing an optical MEMS structure on the wafer level, according to some aspects of the disclosure.

FIG. 7 is a diagram illustrating another example of a testing system in which the micro-optical bench components 210 are integrated on the optical probe card 230, according to some aspects of the disclosure. In the example shown in FIG. 7, the cleaved surfaces of the input and output optical fibers 236 are coated with a respective reflective coating 700 (e.g., a dielectric or metallic coating). Thus, instead of using total internal reflection, the coated surfaces 700 of each of the cleaved optical fibers 236 function as the micro-optical bench components 210 to redirect the input and output beam between the out-of-plane direction and the in-plane direction.

Figure 8:
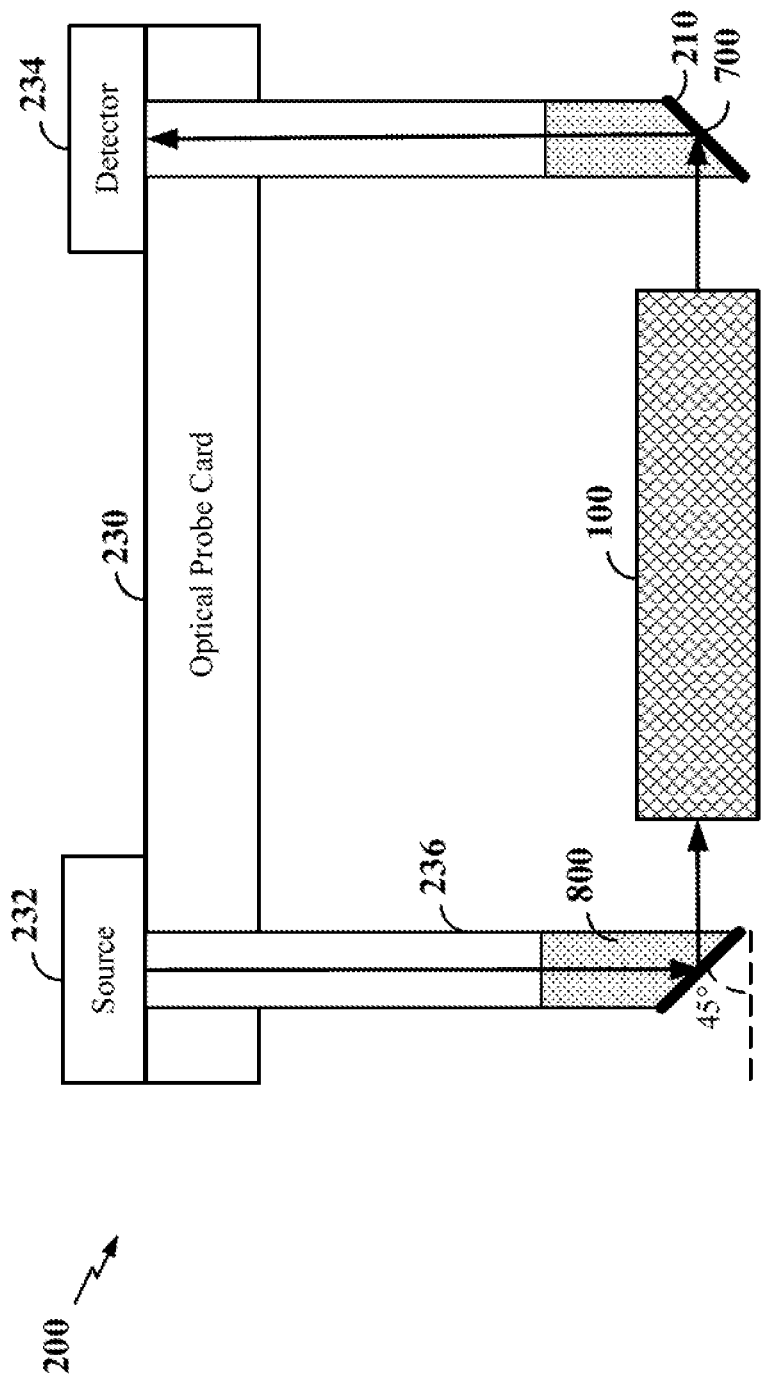
FIG. 8 is a diagram illustrating another example of a system including an integrated optical probe card having micro-optical bench components for testing an optical MEMS structure on the wafer level, according to some aspects of the disclosure.

FIG. 8 is a diagram illustrating another example of a testing system 200 in which the micro-optical bench components are integrated on the optical probe card 230, according to some aspects of the disclosure. In the example shown in FIG. 8, each of the input and output optical fibers 236 includes a respective integrated grin lens 800 to enhance the coupling efficiency of the input and output beams to and from the optical MEMS structure 100 under test by reducing diffraction loss.

Figure 9:
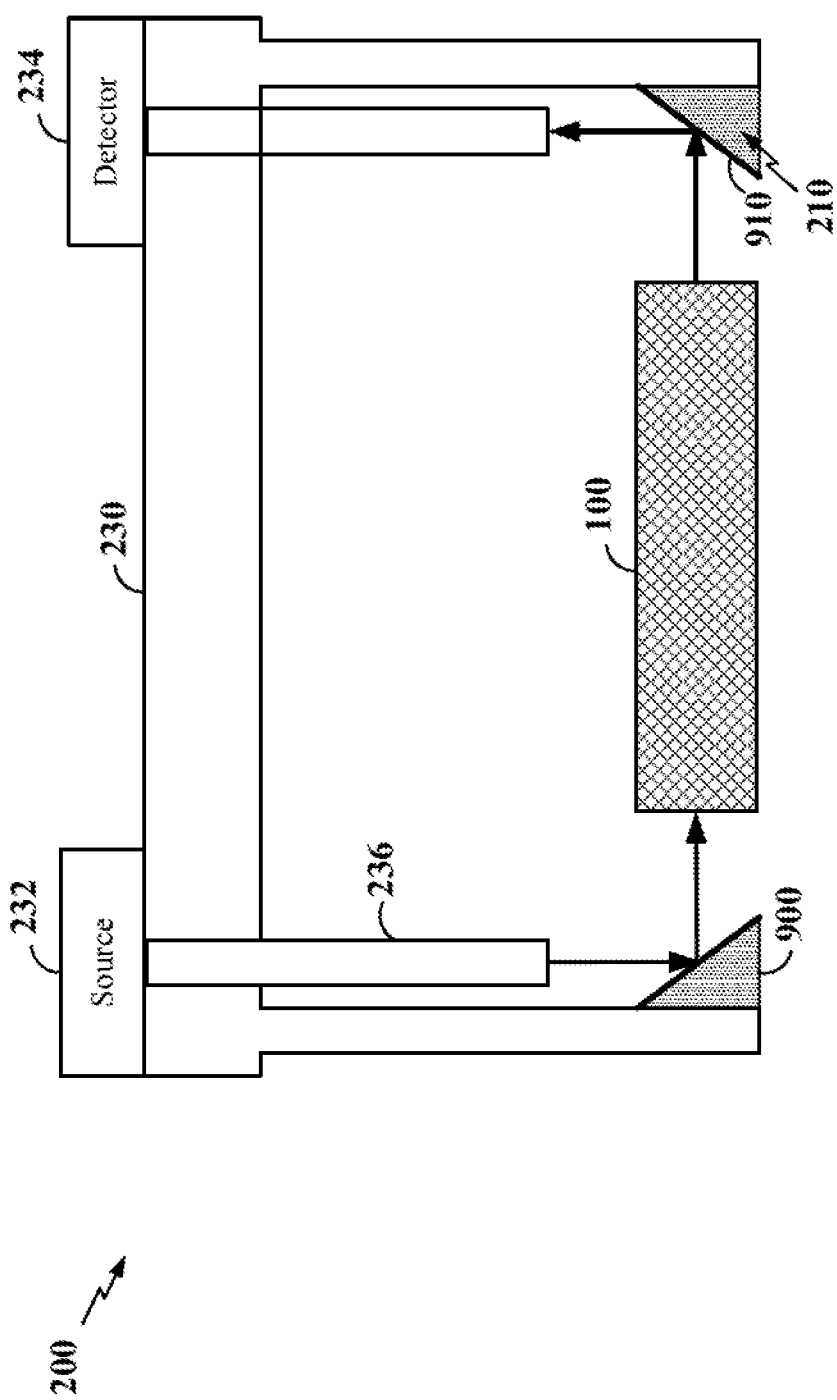
FIG. 9 is a diagram illustrating another example of a system including an integrated optical probe card having micro-optical bench components for testing an optical MEMS structure on the wafer level, according to some aspects of the disclosure.

FIG. 9 is a diagram illustrating another example of a testing system 200 in which the micro-optical bench components 210 are integrated on the optical probe card 230, according to some aspects of the disclosure. In the example shown in FIG. 9, the micro-optical bench components 210 include micro-prisms 900, each having a forty-five degree angled surface 910 that is metallized or coated with another reflective material. Each of the micro-prisms 900 is mounted on the body of the optical probe card 230 and aligned with the input/output optical fibers 236.

In an exemplary operation, the source 232 may generate an input beam and direct the input beam via the input optical fiber 236 towards an input micro-prism 900 positioned adjacent to an input of an optical MEMS structure 100 under test. The input micro-prism 900 is optically coupled to redirect the input beam from the out-of-plane direction to the in-plane direction towards the input of the optical MEMS structure 100 under test. An output micro-prism 900 positioned adjacent to an output of the optical MEMS structure 100 under test is optically coupled to receive the output beam propagating in the in-plane direction and to redirect the output beam from the in-plane direction to the out-of-plane direction towards the output optical fiber 236 and detector 234.

Figure 10:
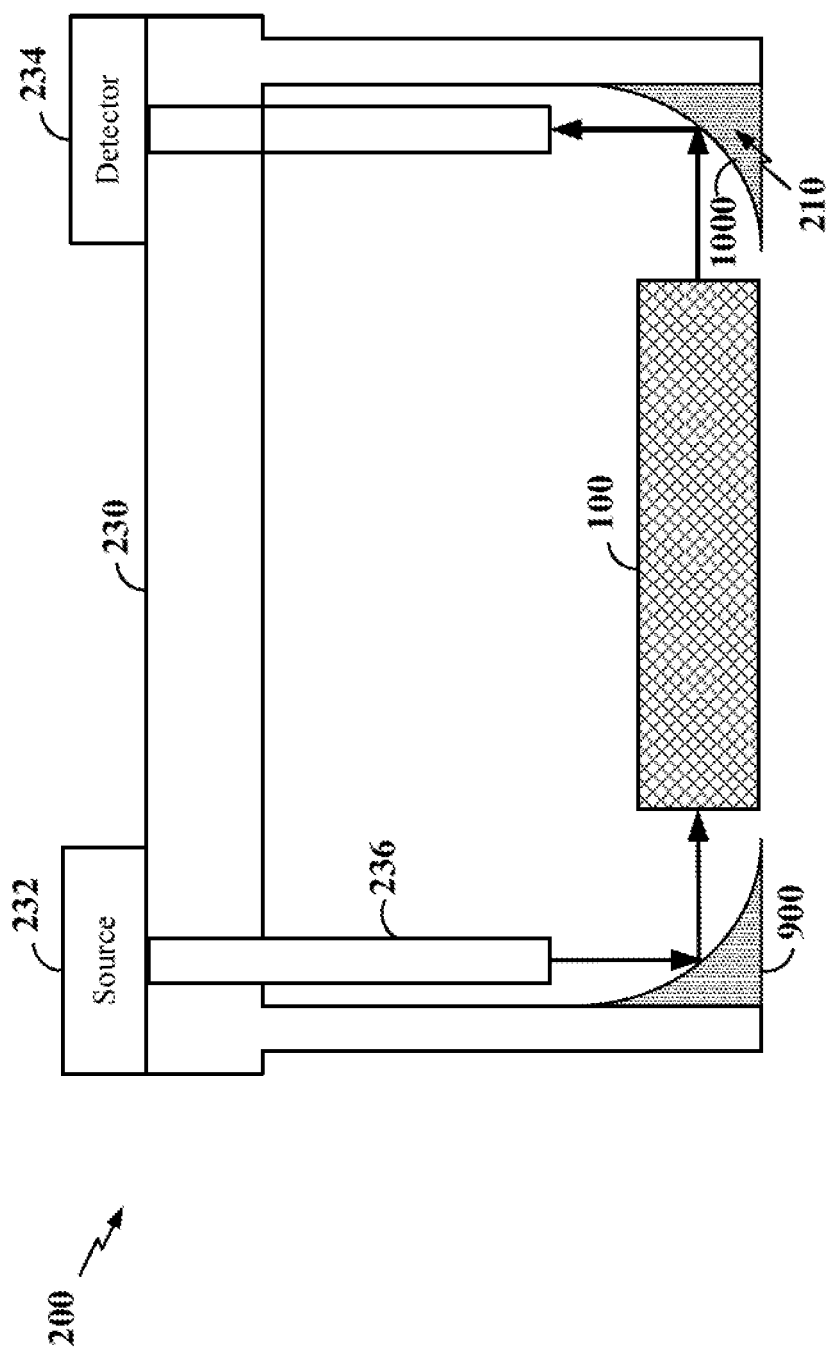
FIG. 10 is a diagram illustrating another example of a system including an integrated optical probe card having micro-optical bench components for testing an optical MEMS structure on the wafer level, according to some aspects of the disclosure.

FIG. 10 is a diagram illustrating another example of a testing system 200 including micro-optical bench components 210 integrated on the optical probe card 230, according to some aspects of the disclosure. In the example shown in FIG. 10, the micro-optical bench components 210 include micro-prisms 900, each having a metallized curved surface 1000. In some examples, the curved surfaces 1000 may be designed to enhance the optical coupling efficiency of the optical probe card 230 by focusing the input beam into the optical MEMS structure 100 under test and focusing the output beam towards the output optical fiber 236.

Figure 11:
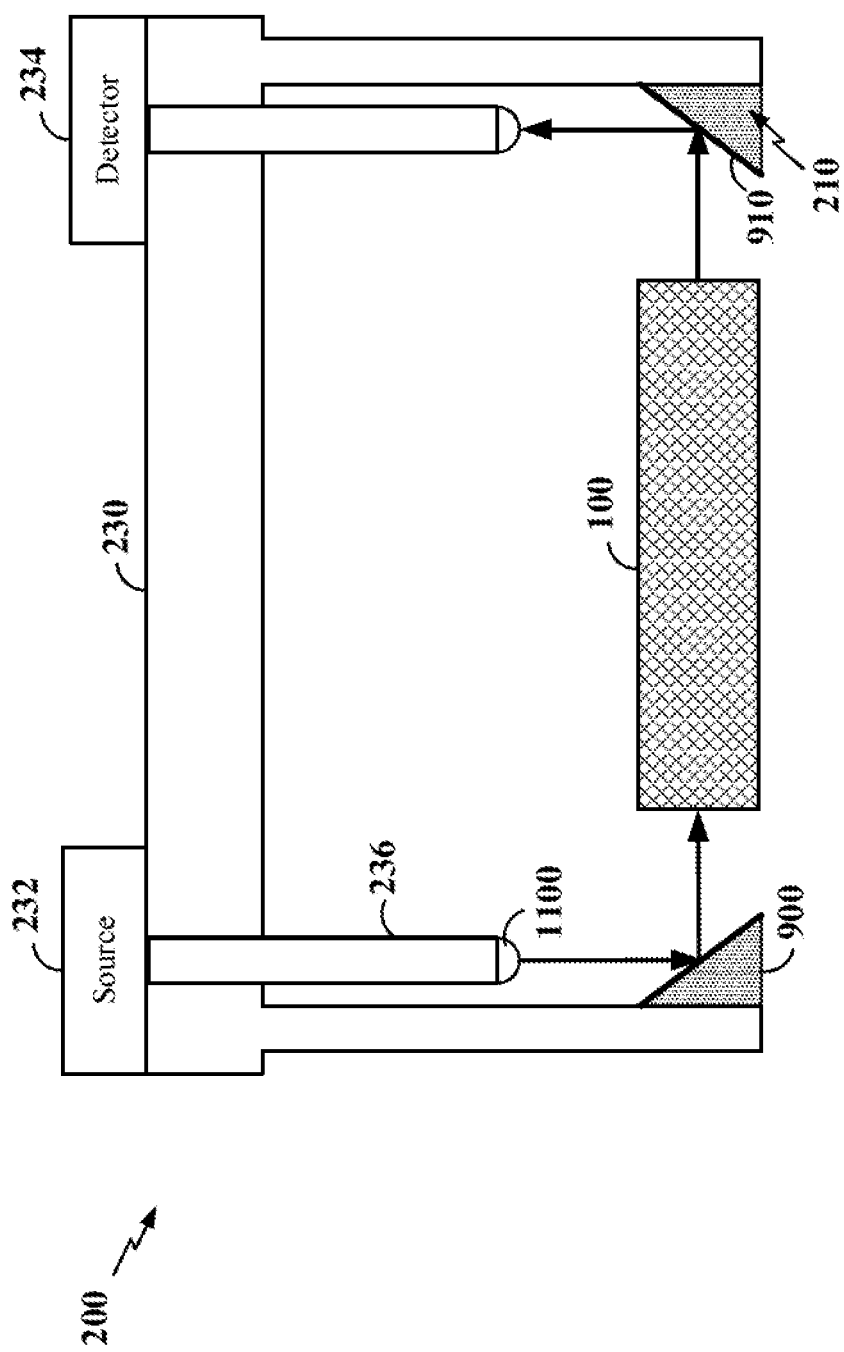
FIG. 11 is a diagram illustrating another example of a system including an integrated optical probe card having micro-optical bench components for testing an optical MEMS structure on the wafer level, according to some aspects of the disclosure.

FIG. 11 is a diagram illustrating another example of a testing system 200 in which the micro-optical bench components 210 are integrated on the optical probe card 230, according to some aspects of the disclosure. In the example shown in FIG. 11, each of the input and output optical fibers 236 are lensed fibers including respective lenses 1100. The integrated lenses 1100 on the optical fibers 236 may be, for example, cylinder lenses, ball lenses, or grin lenses. In some examples, the lensed optical fibers 236 may be designed to enhance the optical coupling efficiency of the optical probe card 230 by focusing the input beam into the optical MEMS structure 100 under test via the input micro-prism 900 and focusing the output beam received from the output micro-prism 900 towards the detector 234.

Figure 12:
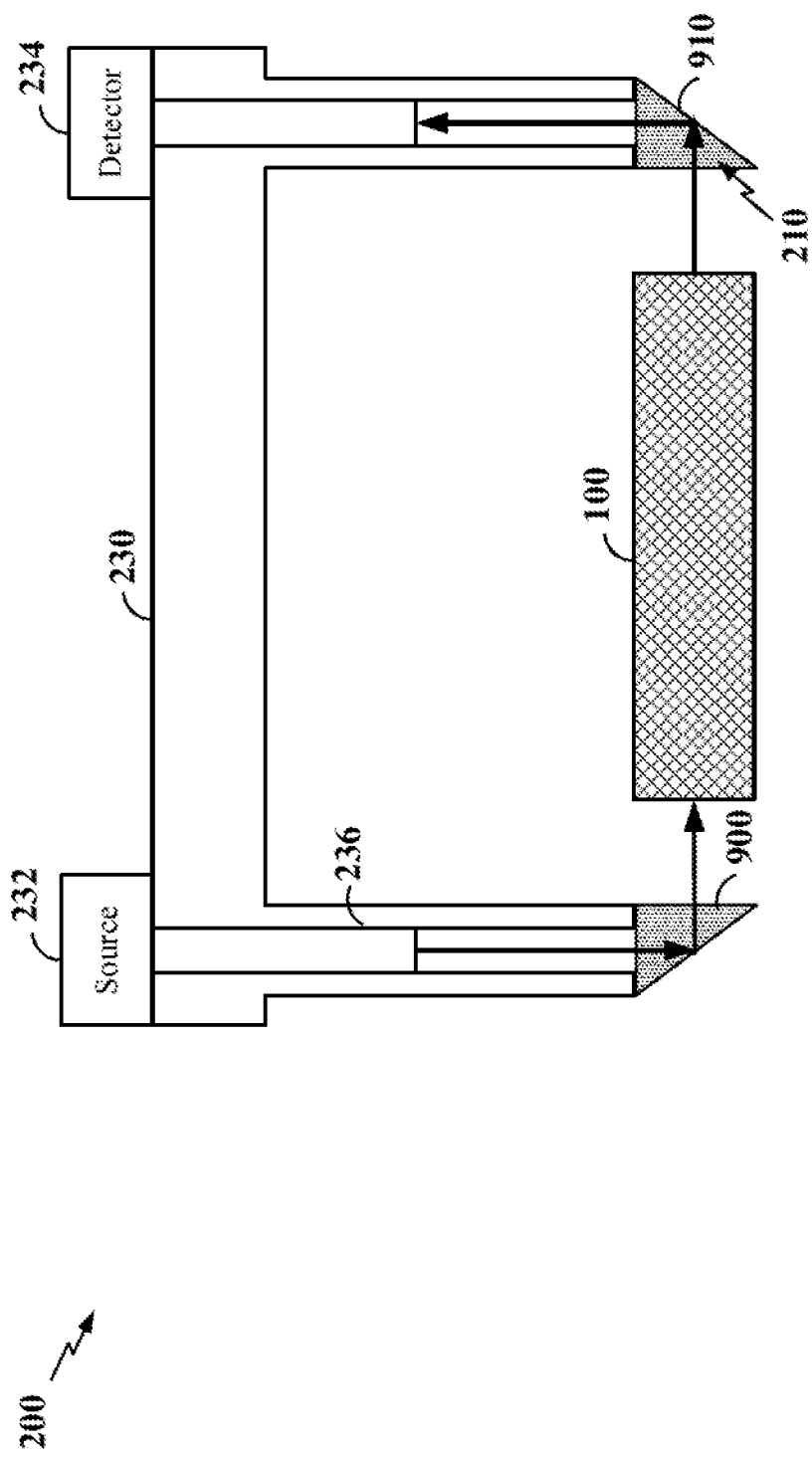
FIG. 12 is a diagram illustrating another example of a system including an integrated optical probe card having micro-optical bench components for testing an optical MEMS structure on the wafer level, according to some aspects of the disclosure.

FIG. 12 is a diagram illustrating another example of a testing system 200 in which the micro-optical bench components 210 are integrated on the optical probe card 230, according to some aspects of the disclosure. In the example shown in FIG. 12, the micro-optical bench components 210 include micro-prisms 900, each having a forty-five degree angled surface 910 that is not metallized to enable each of the micro-prisms to utilize total internal reflection within the micro-prisms 900 to redirect the input and output beams between the out-of-plane direction and the in-plane direction. Each of the micro-prisms 900 is mounted on the body of the optical probe card 230 and aligned with the input/output optical fibers 236.

Figure 13:
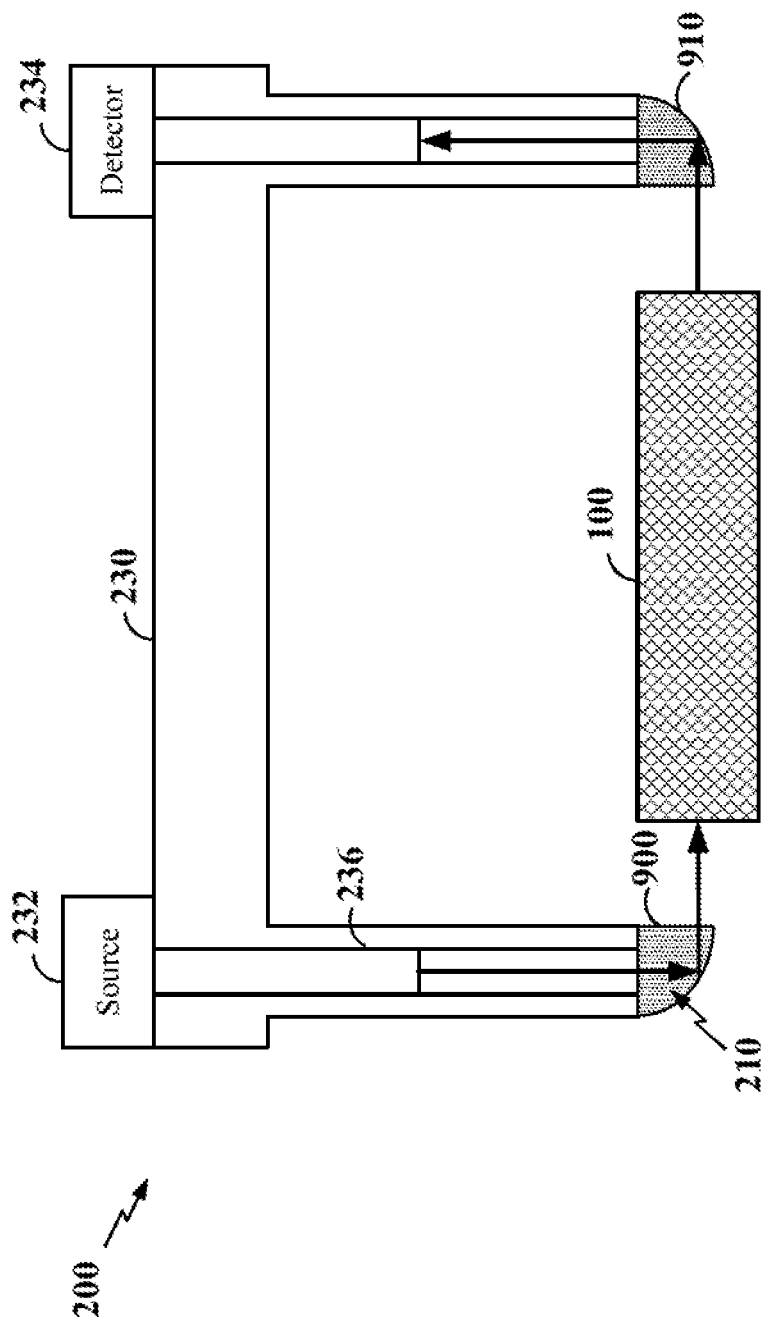
FIG. 13 is a diagram illustrating another example of a system including an integrated optical probe card having micro-optical bench components for testing an optical MEMS structure on the wafer level, according to some aspects of the disclosure.

FIG. 13 is a diagram illustrating another example of a testing system 200 in which the micro-optical bench components 210 are integrated on the optical probe card 230, according to some aspects of the disclosure. In the example shown in FIG. 13, the micro-optical bench components 210 include micro-prisms 900 fabricated with curved surfaces 910 that facilitate total internal reflection to enhance the optical coupling efficiency of the optical probe card by focusing the input beam into the optical MEMS structure 100 under test and focusing the output beam toward the output optical fiber 236.

Figure 14:
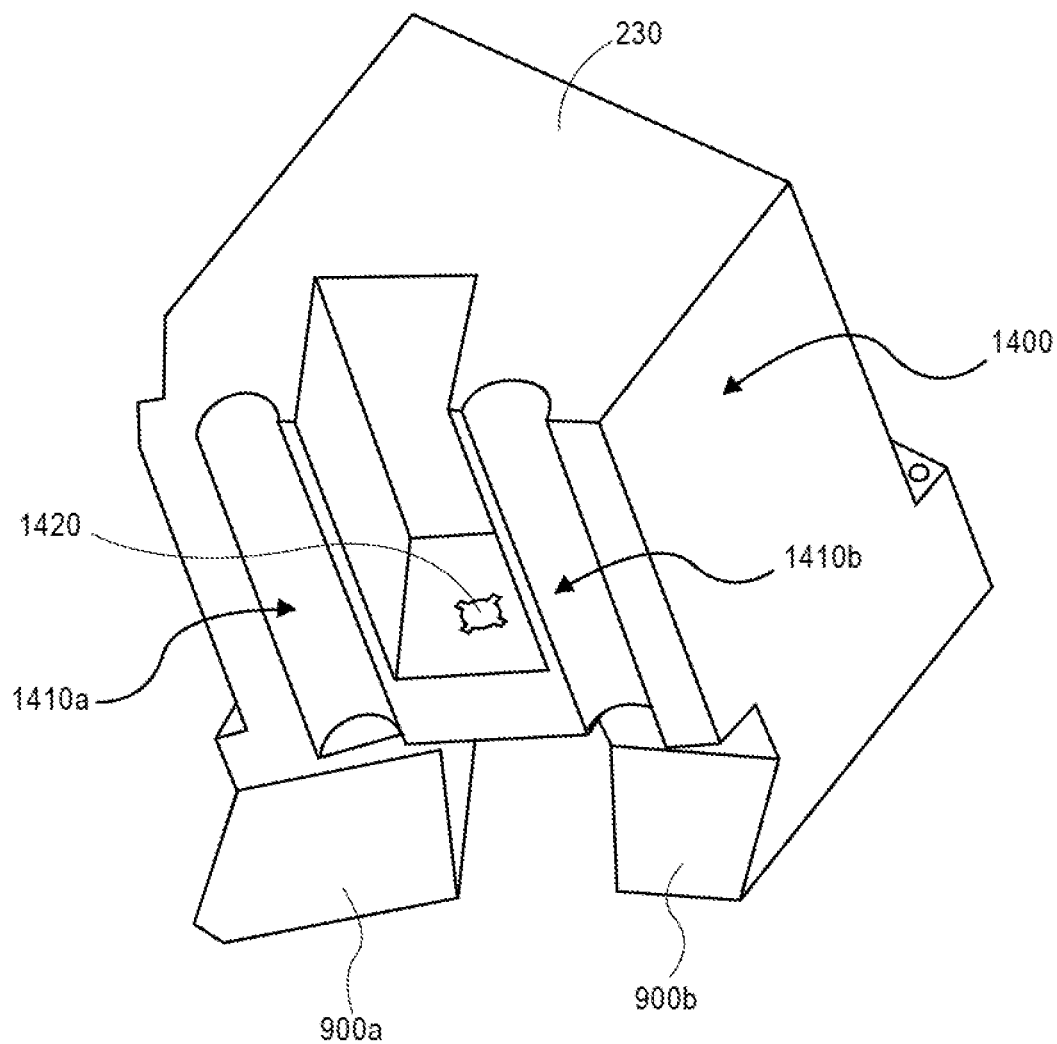
FIG. 14 is a diagram illustrating a perspective view of a portion of an integrated optical probe card, according to some aspects of the disclosure.

FIG. 14 is a diagram illustrating a perspective view of a portion of an integrated optical probe card 230, according to some aspects of the disclosure. In particular, FIG. 14 illustrates a body 1400 of the integrated optical probe card 230 including two adjacent optical metallized micro-prisms 900a and 900b fabricated therein, each having an inclination of forty-five degrees to redirect the input beam and the output beam between the out-of-plane direction and the in-plane direction. The integrated optical probe card 230 further includes two half-cylinders (grooves) 1410a and 1410b configured to receive input and output optical fibers, respectively (e.g., the input and output optical fibers may be inserted into the grooves 1410a and 1410b). The input and output optical fibers may then be connected to the source and detector, respectively, which may, in some examples, be integrated directly into the two grooves 1410a and 1410b. The integrated optical probe card 230 further includes at least one cross alignment mark 1420, which may be used to align the integrated optical probe card 230 when the integrated optical probe card is assembled on another device, such as an electronic probe card.

Figure 15:
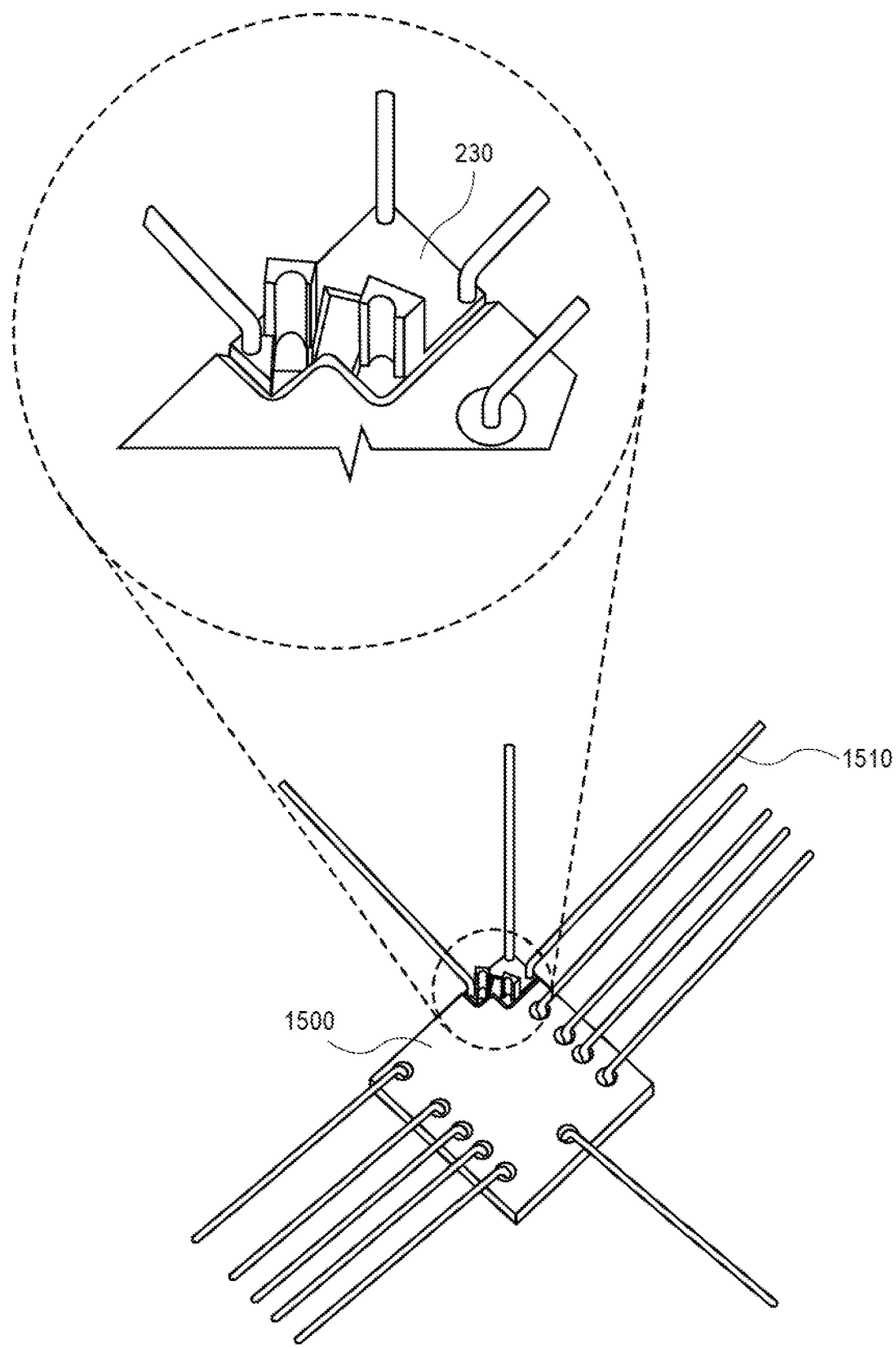
FIG. 15 is a diagram illustrating an example of an electronic probe card including the integrated optical probe card, according to some aspects of the disclosure.

FIG. 15 is a diagram illustrating an example of an electronic probe card 1500 including the integrated optical probe card 230, according to some aspects of the disclosure. The electronic probe card includes a plurality of electronic needles 1510 for contacting the dies under test at specific locations to supply input electrical signals and then probe out the output signals. The integrated optical probe card 230 may be attached to the body of the electronic probe card 1500 at any place on the electronic probe card 1500 and via any attachment mechanism. In the example shown in FIG. 15, the integrated optical probe card 230 is integrated with the electronic probe card 1500 on the electronic needles 1510. For example, the integrated optical probe card 230 may be assembled on one of the electronic needles 1510 or on several of the electronic needles 1510 (as shown in FIG. 15) to provide additional support for the optical probe card 230.

Figure 16:
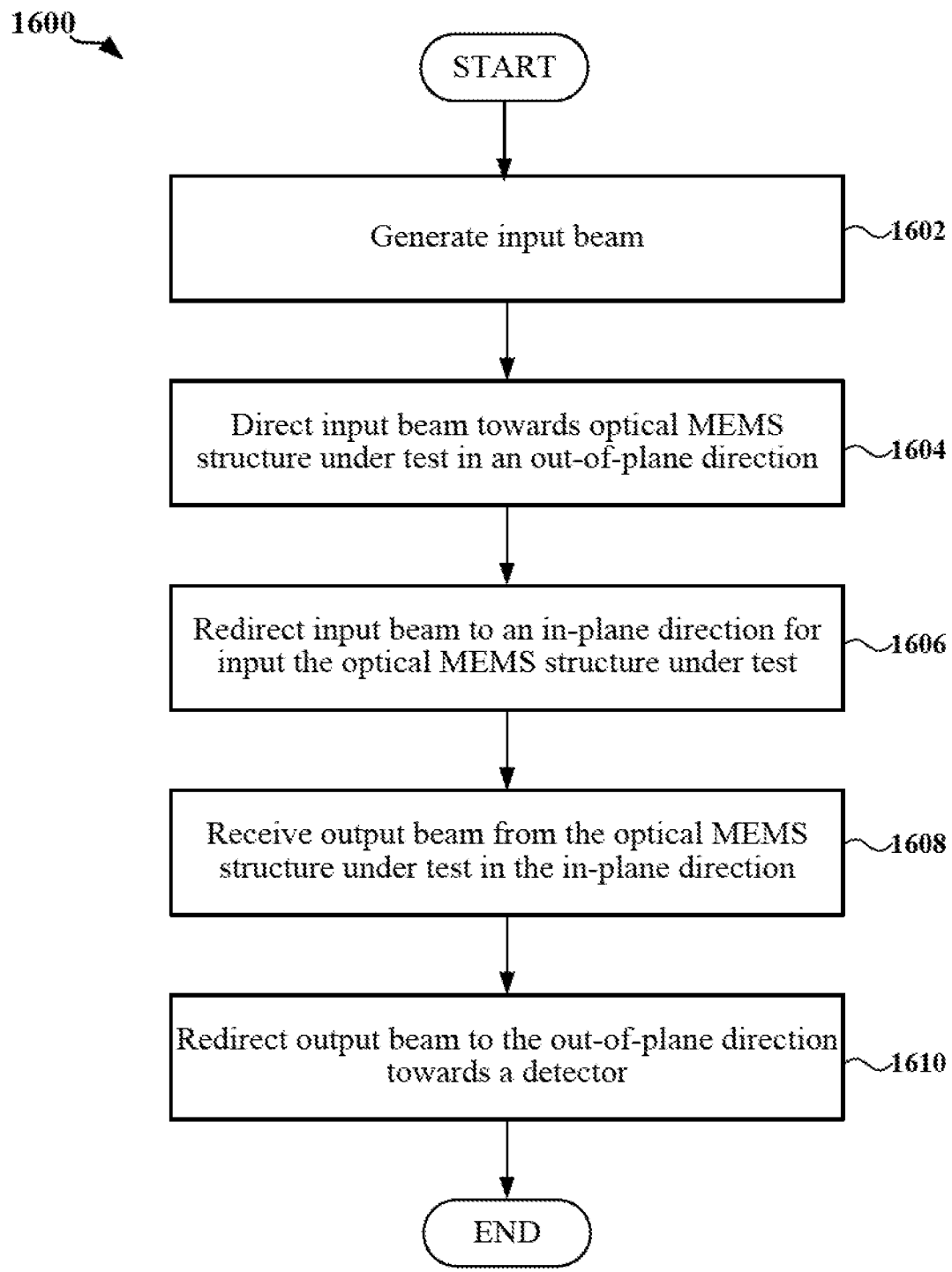
FIG. 16 is a flow chart illustrating an exemplary process for on-wafer testing of optical MEMS structures with in-plane optical axes, according to some aspects of the disclosure.

FIG. 16 is a flow chart illustrating an exemplary process 1600 for on-wafer testing of optical MEMS structures with in-plane optical axes, according to some aspects of the disclosure. The process begins at block 1602, where an input beam is generated by a source. At block 1604, the input beam may be directed towards an optical MEMS structure under test in an out-of-plane direction perpendicular to the in-plane optical axis of the optical MEMS structure under test.

At block 1606, the input beam may be redirected from the out-of-plane direction to an in-plane direction that includes the in-plane optical axis. For example, one or more micro-optical bench components may redirect the input beam to the in-plane direction for input to the optical MEMS structure under test. At block 1608, an output beam may be received from the optical MEMS structure under test in the in-plane direction. At block 1610, the output beam may be redirected from the in-plane direction to the out-of-plane direction towards a detector.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-16 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-15 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. An integrated optical probe card for batch testing optical MEMS structures, comprising:
   a source configured to generate an input beam and to provide the input beam towards an optical MEMS structure, wherein optical MEMS structure comprises an in-plane optical axis, wherein the input beam propagates in an out-of-plane direction perpendicular to the in-plane optical axis;
   a detector optically coupled to receive an output beam from the optical MEMS structure, wherein the output beam propagates in the out-of-plane direction; and
   a micro-optical bench component optically coupled to redirect the input beam received from the source from the out-of-plane direction to an in-plane direction and to redirect the output beam received from the optical MEMS structure from the in-plane direction to the out-of-plane direction, wherein the in-plane direction comprises the in-plane optical axis of the optical MEMS structure.

2. The integrated optical probe card of claim 1, wherein the micro-optical bench component comprises:
   a first micro-optical bench component optically coupled to redirect the input beam from the out-of-plane direction to the in-plane direction for propagation of the input beam inside the optical MEMS structure; and
   a second micro-optical bench component optically coupled to redirect the output beam from the in-plane direction to the out-of-plane direction.

3. The integrated optical probe card of claim 2, wherein:
   the first micro-optical bench component comprises a first optical fiber cleaved by a cleaving angle of forty-five degrees to produce a first cleaved surface; and
   the second micro-optical bench component comprises a second optical fiber cleaved by the cleaving angle of forty-five degrees to produce a second cleaved surface.

4. The integrated optical probe card of claim 3, wherein:
   the first cleaved surface is configured to redirect the input beam from the out-of-plane direction to the in-plane direction towards the optical MEMS structure utilizing total internal reflection; and
   the second cleaved surface is configured to redirect the output beam from the in-plane direction to the out-of-plane direction towards the detector utilizing total internal reflection.

5. The integrated optical probe card of claim 3, wherein:
   the first cleaved surface comprises a first reflective coating configured to redirect the input beam from the out-of-plane direction to the in-plane direction towards the optical MEMS structure; and
   the second cleaved surface comprises a second reflective coating configured to redirect the output beam from the in-plane direction to the out-of-plane direction towards the detector.

6. The integrated optical probe card of claim 5, wherein each of the first and second optical fibers comprises a respective integrated grin lens.

7. The integrated optical probe card of claim 2, wherein the first micro-optical bench component comprises a first micro-prism and the second micro-optical bench component each comprise a second micro-prism, and further comprising:
   an input optical fiber optically coupled to receive the input beam from the source and to direct the input beam towards the first micro-prism; and
   an output optical fiber optically coupled to receive the output beam from the second micro-prism and to direct the output beam towards the detector.

8. The integrated optical probe card of claim 7, wherein:
   the first micro-prism comprises a first metallized surface configured to redirect the input beam from the out-of-plane direction to the in-plane direction towards the optical MEMS structure; and
   the second micro-prism comprises a second metallized surface configured to redirect the output beam from the in-plane direction to the out-of-plane direction towards the detector.

9. The integrated optical probe card of claim 8, wherein the first metallized surface and the second metallized surface each comprises a respective curved surface.

10. The integrated optical probe card of claim 8, wherein:
    the input optical fiber comprises a first integrated lens optically coupled to focus the input beam into the optical MEMS structure via the first micro-prism; and
    the output optical fiber comprises a second integrated lens optically coupled to focus the output beam towards the detector.

11. The integrated optical probe card of claim 7, wherein:
    the first micro-prism is configured to redirect the input beam from the out-of-plane direction to the in-plane direction towards the optical MEMS structure utilizing total internal reflection; and
    the second micro-prism is configured to redirect the output beam from the in-plane direction to the out-of-plane direction towards the detector utilizing total internal reflection.

12. The integrated optical probe card of claim 11, wherein each of the first micro-prism and the second micro-prism comprises a respective curved surface.

13. The integrated optical probe card of claim 1, further comprising:
    a single core optical fiber optically coupled to direct the input beam propagating in the out-of-plane direction towards the micro-optical bench component and further optically coupled to receive the output beam propagating in the out-of-plane direction from the micro-optical bench component; and
    a directional coupler optically coupled to the single core fiber, the source and the detector, wherein the directional coupler is configured to direct the input beam from the source to the single core fiber and to direct the output beam from the single core fiber to the detector.

14. The integrated optical probe card of claim 1, further comprising:
    a dual core optical fiber or optical fiber bundle optically coupled to direct the input beam from the source towards the micro-optical bench component and further optically coupled to direct the output beam from the micro-optical bench component to the detector.

15. The integrated optical probe card of claim 1, wherein the integrated optical probe card is attached to an electronic probe card.

16. The integrated optical probe card of claim 15, wherein the integrated optical probe card is assembled on one or more electronic needles of the electronic probe card.

17. The integrated optical probe card of claim 1, further comprising:
    a probe card body on which the micro-optical bench component is fabricated and further comprising at least one groove fabricated on the probe card body that is configured to receive at least one optical fiber.

18. A wafer, comprising:
a plurality of dies under test, each of the dies under test comprising a respective one of a plurality of optical MEMS structures, each of the plurality of optical MEMS structures comprising an in-plane optical axis; and
a plurality of micro-prisms fabricated within a plurality of dicing streets between the plurality of dies under test, wherein a first micro-prism of the plurality of micro-prisms is fabricated within a first dicing street of the plurality of dicing streets on a first side of a first optical MEMS structure of the plurality of optical MEMS structures and a second micro-prism of the plurality of micro-prisms is fabricated within a second dicing street of the plurality of dicing streets on a second side of the first optical MEMS structure;
wherein each of the plurality of micro-prisms comprises at least one of a first surface or a second surface;
wherein the first surface is configured to receive an input beam from an optical probe card propagating in an out-of-plane direction perpendicular to the in-plane optical axis and to redirect the input beam from the out-of-plane direction to an in-plane direction comprising the in-plane optical axis towards a respective optical MEMS structure of the plurality of optical MEMS structures for propagation of the input beam inside the respective optical MEMS structure;
wherein the second surface is configured to receive an output beam from the respective optical MEMS structure propagating in the in-plane direction and to redirect the output beam from the in-plane direction to the out-of-plane direction towards the optical probe card;
wherein the first micro-prism comprises the first surface configured to receive the input beam from the optical probe card, the first surface comprising a first reflective coating configured to redirect the input beam from the out-of-plane direction to the in-plane direction towards the first optical MEMS structure;
wherein the second micro-prism comprises the second surface configured to receive the output beam from the first optical MEMS structure, the second surface comprising a second reflective coating configured to redirect the output beam from the in-plane direction to the out-of-plane direction towards the optical probe card.

19. A wafer, comprising:
a plurality of dies under test, each of the dies under test comprising a respective one of a plurality of optical MEMS structures, each of the plurality of optical MEMS structures comprising an in-plane optical axis; and
a plurality of micro-prisms fabricated within a plurality of dicing streets between the plurality of dies under test, wherein a first micro-prism of the plurality of micro-prisms is fabricated within a first dicing street of the plurality of dicing streets on a first side of a first optical MEMS structure of the plurality of optical MEMS structures and a second micro-prism of the plurality of micro-prisms is fabricated within a second dicing street of the plurality of dicing streets on a second side of the first optical MEMS structure;
wherein the first micro-prism is configured to receive an input beam from an optical probe card propagating via a backside of the wafer in an out-of-plane direction perpendicular to the in-plane optical axis and to redirect the input beam from the out-of-plane direction to an in-plane direction comprising the in-plane optical axis towards the first optical MEMS structure utilizing total internal reflection; and
wherein the second micro-prism is configured to redirect the output beam from the in-plane direction to the out-of-plane direction utilizing total internal reflection for propagation of the output beam in the out-of-plane direction towards the optical probe card via the backside of the wafer.

20. A wafer, comprising:
a plurality of dies under test, each of the dies under test comprising a respective one of a plurality of optical MEMS structures, each of the plurality of optical MEMS structures comprising an in-plane optical axis; and
a plurality of micro-prisms fabricated within a plurality of dicing streets between the plurality of dies under test, wherein a single first micro-prism of the plurality of micro-prisms is fabricated within a first dicing street of the plurality of dicing streets on a first side of a first optical MEMS structure of the plurality of optical MEMS structures;
wherein the single first micro-prism is configured to receive an input beam from an optical probe card propagating in an out-of-plane direction perpendicular to the in-plane optical axis and to redirect the input beam from the out-of-plane direction to an in-plane direction comprising the in-plane optical axis towards an optical MEMS structure of the plurality of optical MEMS structures for propagation of the input beam inside the optical MEMS structure; and
wherein the single first micro-prism is further configured to receive an output beam from the optical MEMS structure propagating in the in-plane direction and to redirect the output beam from the in-plane direction to the out-of-plane direction towards the optical probe card.

21. A system for performing wafer testing, comprising:
a wafer comprising a plurality of dies under test, each of the dies under test comprising a respective one of a plurality of optical MEMS structures, each of the plurality of optical MEMS structures comprising an in-plane optical axis; and
an optical probe card comprising:
a source configured to generate an input beam and to provide the input beam towards an optical MEMS structure of the plurality of optical MEMS structures, wherein the input beam propagates in an out-of-plane direction perpendicular to the in-plane axis; and
a detector optically coupled to receive an output beam from the optical MEMS structure, wherein the output beam propagates in the out-of-plane direction; and
a micro-optical bench component optically coupled to redirect the input beam and the output beam between the out-of-plane direction and an in-plane direction, wherein the in-plane direction comprises the in-plane optical axis of the optical MEMS structure, wherein the micro-optical bench component is fabricated on the optical probe card.

* * * * *